(12) United States Patent
Ren

(10) Patent No.: US 7,267,741 B2
(45) Date of Patent: Sep. 11, 2007

(54) SILICON CARBIDE COMPONENTS OF SEMICONDUCTOR SUBSTRATE PROCESSING APPARATUSES TREATED TO REMOVE FREE-CARBON

(75) Inventor: Daxing Ren, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 206 days.

(21) Appl. No.: 10/706,938

(22) Filed: Nov. 14, 2003

(65) Prior Publication Data

US 2005/0106884 A1 May 19, 2005

(51) Int. Cl.
*C23F 1/00* (2006.01)
*H01L 21/306* (2006.01)

(52) U.S. Cl. .............................. 156/345.1; 156/345.51
(58) Field of Classification Search .................. None
See application file for complete search history.

(56) References Cited

U.S. PATENT DOCUMENTS

| | | | |
|---|---|---|---|
| 4,529,474 A | 7/1985 | Fujiyama et al. | |
| 5,820,723 A | 10/1998 | Benjamin et al. | |
| 6,073,577 A | 6/2000 | Lilleland et al. | |
| 6,129,808 A | 10/2000 | Wicker et al. | |
| 6,136,211 A | 10/2000 | Qian et al. | |
| 6,379,575 B1* | 4/2002 | Yin et al. ...................... | 216/67 |
| 6,391,787 B1 | 5/2002 | Dhindsa et al. | |
| 6,464,843 B1* | 10/2002 | Wicker et al. ......... | 204/192.15 |
| 6,659,111 B1* | 12/2003 | Mouri et al. ................ | 134/22.1 |
| 6,767,836 B2* | 7/2004 | San et al. .................... | 438/710 |
| 6,776,581 B2* | 8/2004 | Ishikawa ..................... | 416/180 |
| 6,872,322 B1* | 3/2005 | Chow et al. .................. | 216/67 |
| 6,899,785 B2* | 5/2005 | Dutra et al. ............. | 156/345.3 |
| 2002/0123230 A1 | 9/2002 | Hubacek | |

OTHER PUBLICATIONS

Commonly owned U.S. Appl. No. 09/607,922, filed Jun. 30, 2000.
International Preliminary Report on Patentability for PCT/US2004/037945 dated May 15, 2006.

* cited by examiner

*Primary Examiner*—Duy-Vu N Deo
(74) *Attorney, Agent, or Firm*—Buchanan Ingersoll & Rooney PC

(57) ABSTRACT

Silicon carbide components of a plasma processing apparatus, methods of making the components, and methods of using the components during processing of semiconductor substrates to provide for reduced particle contamination of the substrates are provided. The silicon carbide components are made by a process that results in free-carbon in the components. The silicon carbide components are treated to remove the free-carbon from at least the surface.

23 Claims, 2 Drawing Sheets

SILICON CARBIDE COMPONENTS OF SEMICONDUCTOR SUBSTRATE PROCESSING APPARATUSES TREATED TO REMOVE FREE-CARBON

BACKGROUND

Semiconductor substrate materials are processed by various processes including deposition processes, such as chemical vapor deposition (CVD) of metal, dielectric and semiconducting materials; etching processes; and photoresist removal processes. Plasma etching is conventionally used to etch metal, dielectric and semiconducting materials.

SUMMARY

Methods of treating silicon carbide components of semiconductor substrate processing apparatuses, methods of making such components, and components treated by the methods are provided. The methods remove free-carbon, e.g., graphite, from the components, thereby reducing particle contamination of semiconductor substrates by the components during processing of semiconductor substrates in a plasma processing chamber.

Silicon carbide components that can be treated by the methods include, for example, baffle plates and gas distribution plates of showerhead electrode assemblies, edge rings, focus rings, plasma confinement rings, chamber liners, electrodes, wafer passage inserts, windows, plasma screens, and chamber walls.

In a preferred embodiment, the silicon carbide components that are treated are made by a process, such as reaction synthesis of silicon vapor with carbon, that results in the components including trace free-carbon. The silicon carbide components are porous and include an interior and an exposed surface. As a result of the manufacturing process, such as the incomplete conversion of carbon during reaction synthesis of silicon vapor with carbon to make silicon carbide, and mechanical treating, e.g., grinding, of the silicon carbide, the components include free-carbon in the interior and on the exposed surface. As used herein, the term "exposed surface" means a surface of the component that has been exposed by removing material from the silicon carbide component by a treatment, e.g., by mechanical grinding, and that has free-carbon on the surface. A preferred method treats such silicon carbide component of a semiconductor processing apparatus to remove at least substantially all of the free-carbon on the exposed surface.

A preferred method of removing the free-carbon comprises heating a silicon carbide component of a semiconductor processing apparatus including free-carbon in an oxygen-containing atmosphere to remove substantially all of the free-carbon from at least the exposed surface of the component.

Another preferred method comprises contacting a silicon carbide component of a semiconductor processing apparatus including free-carbon with a chemical solution that is effective to remove substantially all of the free-carbon from at least the exposed surface, without substantially removing the silicon carbide.

Yet another preferred method comprises treating a silicon carbide component of a semiconductor processing apparatus including free-carbon with an oxygen plasma to remove substantially all of the free-carbon from at least the exposed surface of the component.

In another preferred embodiment, a silicon carbide component is porous and comprises an interior and an exposed surface. The silicon carbide component has been (i) made by process that results in free-carbon in the interior; (ii) treated to produce the exposed surface which has free-carbon thereon; and (iii) treated to remove the free-carbon such that at least the exposed surface is substantially free of the free-carbon.

Another preferred embodiment provides a semiconductor substrate processing apparatus comprising a plasma processing chamber and at least one silicon carbide component. The silicon carbide component can be, for example, a baffle plate, gas distribution plate, plasma confinement ring, edge ring, focus ring, backing plate, chamber liner, electrode, wafer passage insert, window, plasma screen, or a chamber wall. In a preferred embodiment, the silicon carbide component is at least one baffle plate of a showerhead electrode assembly for distributing process gas into the plasma processing chamber.

Yet another preferred embodiment provides a method of processing a semiconductor substrate in a plasma processing chamber of a semiconductor substrate processing apparatus. The semiconductor processing apparatus includes a plasma processing chamber into which process gas is supplied by a showerhead electrode assembly including a showerhead electrode, a baffle chamber through which process gas passes to the showerhead electrode. At least one silicon carbide component that has been treated by a preferred method of removing free-carbon is provided in the plasma processing apparatus. The method comprises processing a semiconductor substrate in the plasma processing chamber in which the silicon carbide component is provided.

In another preferred embodiment, prior to processing production semiconductor substrates in the plasma processing chamber, the chamber is plasma conditioned. The plasma conditioning comprises successively processing dummy wafers in the plasma processing chamber prior to processing production semiconductor substrates in the chamber. At least one silicon carbide component that has been treated to remove free-carbon is provided in the plasma processing chamber, thereby significantly reducing the number of adder particles deposited on the dummy wafers, and also reducing chamber conditioning time.

DRAWINGS

FIG. 1 is a graph showing the relationship between the number of particle adders counted on semiconductor substrates versus RF hours of plasma conditioning a plasma processing chamber containing a silicon carbide baffle plate that has not been treated to remove free-carbon (Curve A), and a plasma processing chamber containing a silicon carbide baffle plate that has been treated to remove free-carbon (Curve B).

DETAILED DESCRIPTION

Figure 1:
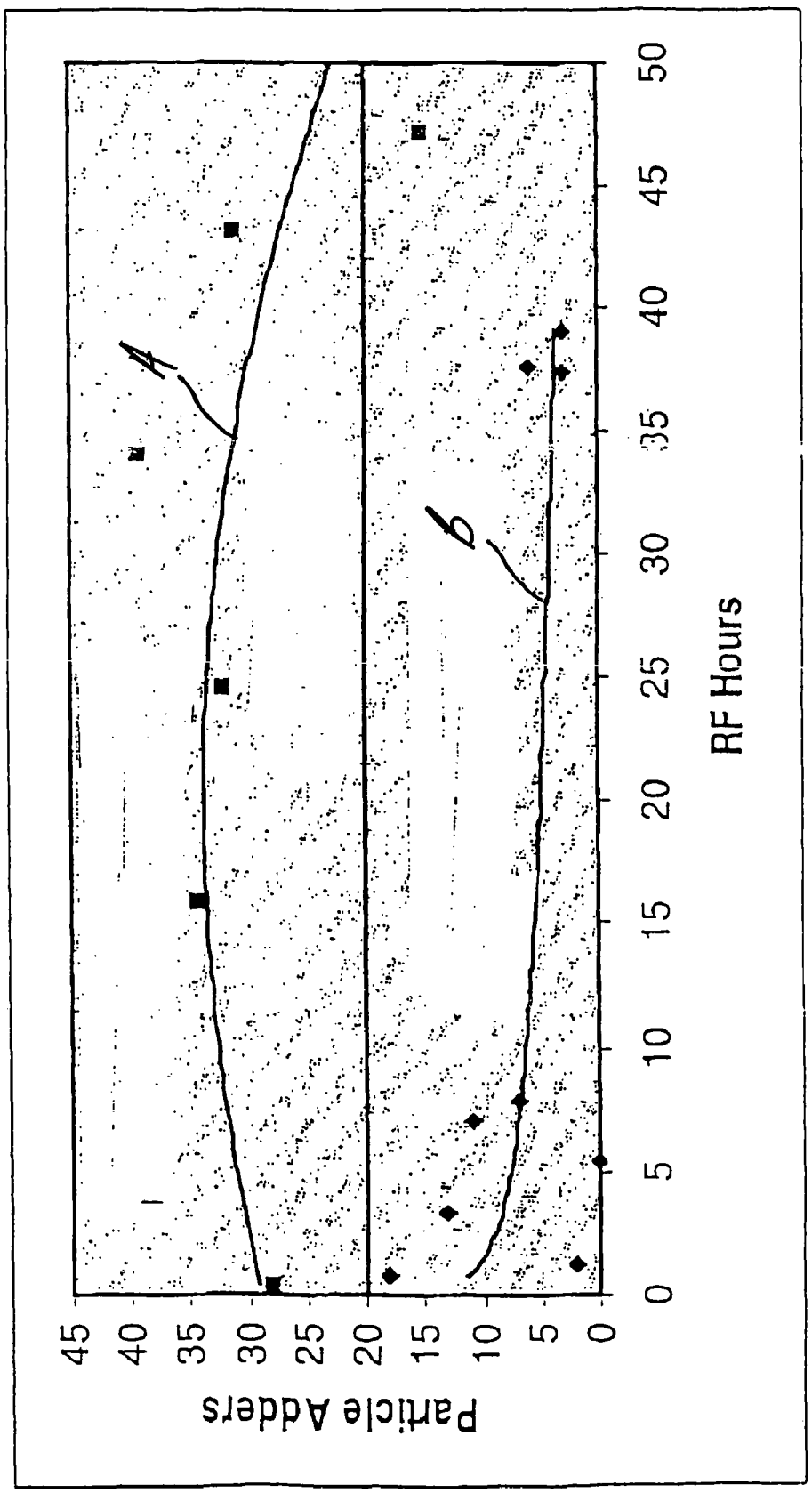

One exemplary type of semiconductor substrate processing apparatus is a parallel plate reactor. A parallel plate reactor comprises a plasma processing chamber including a top electrode, and a substrate support on which a substrate, such as a semiconductor wafer, is supported during plasma processing. The substrate support includes a bottom electrode and a clamping mechanism, e.g., a mechanical chuck or an electrostatic chuck (ESC), for clamping the substrate. The top electrode can be part of a showerhead electrode assembly for distributing process gas in the plasma chamber. The showerhead electrode assembly can include vertically-spaced baffle plates to control the supply of the process gas to the showerhead electrode via a showerhead top electrode.

Semiconductor substrate processing apparatuses can also include components constructed to confine plasma in selected regions of the plasma chamber, such as in a zone defined by the substrate on the substrate support, which typically includes an edge ring, and a plasma confinement ring assembly.

In a typical showerhead electrode assembly including baffle plates, process gas is passed through one or more of the baffle plates before exiting through the showerhead electrode. Plasma can attack at least the bottom baffle plate adjacent the showerhead electrode in the vicinity of the holes in the showerhead electrode. Over time, an erosion pattern can develop on the underside of the baffle plate, resulting in particles, referred to as "adders," being removed from the baffle plate and depositing on substrates. Adders can result in defective semiconductor devices, such as microprocessors, memories, transistors, and the like. Accordingly, it is desirable to minimize the number of adders that are produced during plasma processing operations, such as etching openings into layers on semiconductor substrates.

During plasma processing operations, other plasma exposed components of the semiconductor substrate processing apparatus, such as gas distribution plates, edge rings, focus rings, plasma confinement rings, chamber liners, electrodes, wafer passage inserts, windows, plasma screens, chamber walls, and the like, also can be eroded by plasma, potentially resulting in the contamination of semiconductor substrates by removed particles during plasma processing operations.

Such components of semiconductor substrate processing apparatuses can be manufactured from various materials, including silicon carbide materials. Such silicon carbide components can be made by various processes including, e.g., sintering processes and the reaction synthesis of silicon vapor with carbon. Silicon carbide materials made by such reaction synthesis processes provide favorable properties, such as reduced contamination, wear resistance, and design flexibility for use in plasma environments.

However, it has been determined that silicon carbide components of semiconductor processing apparatuses can include "free-carbon." As defined herein, "free-carbon" is carbon present inside and/or on the surface of the silicon carbide components in the form of discrete carbon particles, or clusters (agglomerates) of carbon particles. The "free-carbon" is distinct from the silicon carbide matrix material, which preferably has a stoichiometric or near-stoichiometric composition. It has also been determined that unless such free-carbon is removed from at least certain portions of such silicon carbide components, the free-carbon may be released as particles when the components are used in a plasma environment. Release of the free-carbon particles can generate adders, which can contaminate semiconductor substrates being processed in the plasma environment.

It has been determined that silicon carbide components containing free-carbon can be treated to remove the free-carbon from at least the exposed surface of such components. It has also been determined that by removing at least the surface free-carbon from the silicon carbide components, the number of particles released from the components during processing in a plasma chamber containing such components can be reduced. Consequently, the incidence of device failures and adversely impacted yields of processed substrates, such as wafers, due to the adders can be significantly reduced.

The silicon carbide material of the silicon carbide components is preferably a high-purity, commercially-manufactured silicon carbide produced by the conversion of a carbon source using silicon vapor. The conversion process includes reacting a shaped piece of carbon, such as graphite, with $SiO_2$ gas, thereby producing SiO gas, and an in situ vapor solid reaction in which the carbon is reacted with the SiO gas to convert the carbon to SiC and produce an excess of carbon monoxide. The starting carbon material is preferably a fine-particle, low-porosity, high-purity grade of graphite. A commercially available silicon carbide material made by conversion of a carbon source is "SUPERSiC" silicon carbide produced by Poco Graphite, Inc. of Decatur, Tex.

It has been determined that components of semiconductor substrate processing apparatuses made by converting graphite to silicon carbide can comprise trace free-carbon, such as graphite particles, resulting from the incomplete conversion of graphite to silicon carbide. The free-carbon can be in the form of carbon particles or carbon clusters in the silicon carbide material formed by incomplete conversion of graphite to silicon carbide. The free-carbon resulting from such processes is located in the interior of the silicon carbide components. However, treating of such components by, e.g., mechanical grinding and/or polishing, can remove surface material and expose free-carbon on the treated surface, which surface is referred herein as an "exposed surface." Free-carbon at the exposed surface of a silicon carbide component is more undesirable regarding particle contamination of substrates than free-carbon located in the interior of the components. Particularly, it has been determined that components including surface free-carbon can be a source of carbon particles until the surface free-carbon has been completely removed by exposure to plasma in the chamber. Removal of the surface free-carbon does not completely solve the particle problem because free-carbon located in the interior of such silicon carbide components becomes exposed as plasma gradually erodes the silicon carbide. Generally, however, less interior free-carbon than surface free-carbon is exposed to plasma at a given time.

It has been determined that plasma-exposed silicon carbide components of a semiconductor substrate processing apparatus that contain free-carbon resulting from incomplete carbon conversion can be treated to remove the free-carbon located at least at the exposed surface of the components to significantly reduce particle contamination of substrates processed in the apparatus. Moreover, as described below, in embodiments of the methods of treating silicon carbide components containing free-carbon at the exposed surface and in the interior, free-carbon can be removed from the exposed surface, as well as from the interior by the treatment.

The methods of treating silicon carbide components to remove free-carbon are preferably used to treat components made by carbon conversion; however, the methods can also be used to remove free-carbon from silicon carbide material made by other processes. For example, the silicon carbide can be a sintered material available, for example, from Cercom, Inc., of Vista, Calif., Carborundum, Inc., of Costa Mesa, Calif. and Ceradyne, Inc. of Costa Mesa, Calif.

It has been determined that the free-carbon present in the silicon carbide components as a result of incomplete carbon conversion can include carbon in the form of carbon clusters, i.e., agglomerates of smaller carbon particles. These clusters can typically have a size of from about 20 μm to about 200 μm, such as from about 50 μm to about 100 μm. Typically, the amount of free-carbon in such silicon carbide components is less than about 1 wt. %, such about 0.5 wt. % or less.

Different methods of removing free-carbon from silicon carbide components of a semiconductor substrate processing apparatus are provided. The silicon carbide components are porous, and are made by a process that results in free-carbon being present in the interior and also on the exposed surface. The methods comprise treating the silicon carbide components to remove at least substantially all of the free-carbon on the exposed surface. Preferably, the treatments remove all of the free-carbon on the exposed surface. Embodiments of the methods can also remove free-carbon throughout the interior of the components.

In a preferred embodiment, the silicon carbide components are made by reaction synthesis of silicon vapor with carbon. As described above, during such processes, incomplete conversion of carbon, such as graphite, can occur, resulting in free-carbon distributed in the interior of the component. The interior free-carbon can be exposed by mechanical treatment. A preferred embodiment of the methods of removing the free-carbon comprises heating the silicon carbide component in an oxygen-containing atmosphere at a temperature and for an amount of time effective to remove substantially all of the free-carbon from the exposed surface. The heating preferably also removes at least some of the free-carbon from the interior of the silicon carbide component, thereby preventing the removed interior free-carbon from potentially being released in a plasma processing chamber.

The silicon carbide component including free-carbon can be heated in any suitable vessel, such as a high-temperature oven or furnace. The oxygen-containing atmosphere can include, but is not limited to, $O_2$, air, water vapor, or a mixture thereof. In a preferred embodiment, the vessel is sealed and the oxygen-containing atmosphere, such as air, is supplied into the vessel via a gas supply system.

The oxygen-containing atmosphere is preferably maintained at a temperature that is effective to oxidize the free-carbon (i.e., convert the free-carbon to CO, $CO_2$ or mixtures thereof), but is sufficiently low to substantially avoid oxidizing the silicon carbide (i.e., adversely affecting mechanical and/or physical properties of the silicon carbide.) Preferably, the temperature of the oxygen-containing atmosphere in the treatment vessel is from about 750° C. to about 1200° C., and more preferably from about 800° C. to about 900° C. The silicon carbide components are treated in the oxygen-containing atmosphere for an amount of time that is effective to remove at least substantially all of the free-carbon from the exposed surface, preferably from about 2 hours to about 12 hours.

It has been determined that heating the silicon carbide components including free-carbon in an oxygen-containing atmosphere can remove all of the free-carbon at the exposed surface of the components. The heating is preferably effective to also remove at least some of the free-carbon throughout the interior of the components. Preferably, the heating preferably removes at least about 80%, and more preferably at least about 90%, of the number of free-carbon particles and/or clusters sized above about 50 μm in the interior. The heating also removes smaller particles and/or clusters from the components. The number of free-carbon particles and/or clusters in silicon carbide components can be measured manually or automatically by any suitable technique, for example, by microscopy, automated image analysis, or the like.

Another preferred method of treating a silicon carbide component to remove free-carbon comprises contacting the silicon carbide component with a chemical solution that is effective to remove substantially all of the free-carbon from at least the surface, but without substantially removing the silicon carbide. Preferably, the chemical solution removes less than about 1% by weight of the silicon carbide. The chemical solution can be any suitable chemical composition that is effective to achieve this result. The chemical solution is preferably an acid solution, e.g., a solution containing nitric acid, sulfuric acid, or the like. To enhance the rate of free-carbon removal, the chemical solution is preferably heated to an elevated temperature. The treatment can include dipping the silicon carbide component into the chemical solution. Alternatively, the chemical solution can be applied to the silicon carbide component by any other suitable process, such as spraying.

The concentration of the chemical solution can be adjusted to control the removal rate of free-carbon so that the treatment can be conducted within a desired treatment time. The concentration of the chemical solution, the solution temperature, pH and other parameters can be selected to achieve the desired rate of removal of the free-carbon. The silicon carbide component can be contacted with the chemical solution for an amount of time effective to remove a desired amount of the free-carbon, preferably to remove at least substantially all of the free-carbon at the exposed surface of the component.

Another preferred method of treating a silicon carbide component to remove free-carbon comprises treating the component with an oxygen plasma to remove substantially all of the free-carbon from at least the surface. For example, the silicon carbide component can be treated in an ashing chamber of a semiconductor substrate processing apparatus to remove free-carbon. The temperature of the silicon carbide component can range, for example, from about 200° C. to about 300° C. during this treatment.

The outer surface of the silicon carbide components can be machined, such as by grinding and/or polishing, to achieve a desired surface finish prior to treating the components to remove the free-carbon by one of the preferred methods. This machining can produce an exposed surface having free-carbon on it.

The surface of the silicon carbide component can be conditioned with plasma after the component has been treated to remove free-carbon by one of the methods described above. The plasma conditioning treatment can be performed to remove attached particles, such as silicon carbide particles, from the surface of the component. Such attached particles can result from machining and/or sintering the component. Suitable methods of conditioning the silicon carbide components are described in commonly-owned U.S. patent application Ser. No. 09/607,922 filed on Jun. 30, 2000, which is incorporated herein by reference in its entirety.

In a preferred embodiment, prior to processing production semiconductor substrates, the plasma processing chamber, which contains one or more silicon carbide components that have been treated to remove free-carbon, is plasma conditioned by processing dummy wafers. The treated silicon carbide component is preferably placed in the plasma processing chamber before production semiconductor substrates are processed.

FIG. 1 shows the relationship between the number of particle adders on semiconductor substrates versus the duration of plasma conditioning of a plasma processing chamber containing a silicon carbide baffle plate that has not been treated to remove free-carbon (Curve A), and a plasma processing chamber containing a silicon carbide baffle plate that has been treated in an oxygen-containing atmosphere to remove free-carbon (Curve B). The horizontal line shows a typical specification of 20 adders having a size of at least about 0.2 µm deposited on 200 mm dummy wafers.

Curve B shows that the number of particle adders having a size of at least about 0.2 µm deposited on 200 mm dummy wafers in the plasma processing chamber was reduced to less than about 10 after just about 2 RF hours of plasma conditioning of the chamber (i.e., the number of hours that a plasma was generated in the plasma reactor during the conditioning), and the number of such particle adders was further decreased to about 5 by extending the duration of the conditioning.

As shown in Curve A, however, the number of particle adders deposited on dummy wafers in the plasma processing chamber that included a silicon carbide lower baffle plate that had not been treated to remove free-carbon was higher than 20, even after over 45 RF hours of plasma conditioning. Accordingly, removal of the free-carbon can significantly reduce the generation of adder particles in a plasma processing chamber.

Silicon carbide components of semiconductor substrate processing apparatuses that can be treated to remove free-carbon by the above-described methods include, but are not limited to, baffle plates, gas distribution plates, edge rings, focus rings, plasma confinement rings, chamber liners, electrodes, wafer passage inserts, windows, plasma screens, and chamber walls. Exemplary components of semiconductor substrate processing apparatuses that include such components are described in U.S. Pat. No. 6,129,808, which is incorporated herein by reference in its entirety.

The silicon carbide components can have various shapes and sizes. The free-carbon containing silicon carbide components that are treated to remove free-carbon can preferably have a thickness of up to about ¼ inch. Thicker components can also be treated, however, such as by the above-described treatment in an oxygen-containing atmosphere.

Figure 2:
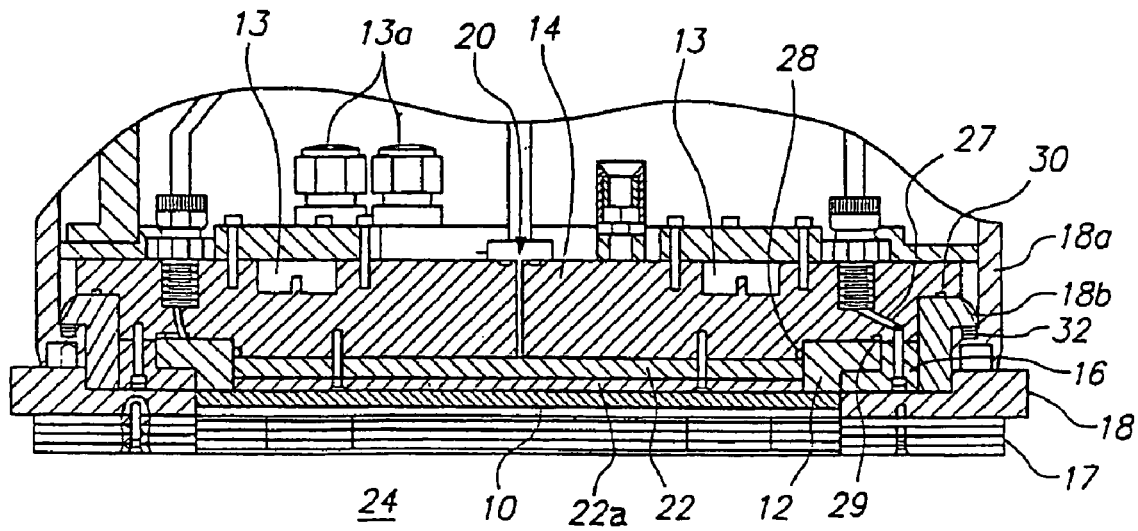
FIG. 2 is a side sectional view of an exemplary embodiment of a showerhead electrode assembly for wafer processing.

In a preferred embodiment, one or more silicon carbide components that have been treated to remove free-carbon are installed in a semiconductor substrate processing apparatus. One such exemplary apparatus is shown in FIG. 2. However, the silicon carbide components can also be used in plasma processing apparatuses having other constructions than shown in FIG. 2. The semiconductor substrate processing apparatus includes a showerhead electrode assembly 10, which is typically used with a substrate support including a chucking mechanism, e.g., an electrostatic chuck, having a flat bottom electrode on which a substrate, e.g., a semiconductor wafer, is supported below the showerhead electrode assembly 10. The substrate support can also include features for controlling the temperature of the substrate. For example, the substrate support can include a wafer backside helium supply system to control heat transfer between the substrate and the chuck, and/or a heat transfer fluid supply system operable to circulate a fluid, e.g., water, through the substrate support.

Another exemplary suitable electrode assembly in which the treated silicon carbide components, such as baffles plates, can be used is described in commonly-owned U.S. Pat. No. 6,391,787, which is incorporated herein by reference in its entirety.

The showerhead electrode assembly 10 can be provided in any type of semiconductor substrate processing apparatus in which a process gas is distributed over a semiconductor substrate. Such apparatuses can include, but are not limited to, CVD systems, ashers, capacitive coupled plasma reactors, inductive coupled plasma reactors, ECR reactors, and the like. The showerhead electrode assembly 10 shown is a consumable part, i.e., it is replaced periodically. Because the showerhead electrode 10 is attached to a temperature-controlled member, for ease of replacement, the upper surface of the showerhead electrode 10 can be bonded to a support ring 12, such as a graphite support ring, by any suitable technique, such as by an elastomeric joint, as described below.

The showerhead electrode 10 shown in FIG. 2 is a planar disk. A support ring 12 having a flange is clamped by a clamping ring 16 to a temperature-controlled member 14, such as an aluminum member, having flow passages 13 through which a heat transfer fluid (liquid or gas) is flowed. For example, water can be circulated in the cooling channels 13 by water inlet/outlet connections 13a. A plasma confinement ring assembly 17 including a stack of plasma confinement rings surrounds the outer periphery of the showerhead electrode 10. The plasma confinement rings can be made of various materials, such as quartz, silicon carbide, and the like. The plasma confinement ring assembly 17 is attached to a dielectric (e.g., quartz) annular ring 18, which in attached to a dielectric housing 18a. The plasma confinement ring assembly 17 produces a pressure differential in the plasma chamber and increases the electrical resistance between the walls of the plasma chamber 24 and the plasma, thereby confining the plasma between the showerhead electrode 10 and the bottom electrode.

In the embodiment of the semiconductor substrate processing apparatus, process gas from a gas supply is supplied to the showerhead electrode 10 via a passage 20 in the temperature-controlled member 14. Process gas is distributed through one or more vertically spaced-apart baffle plates 22 and passes through gas distribution holes (not shown) in the showerhead electrode 10 to evenly disperse the process gas into plasma chamber 24. To enhance heat conduction from the showerhead electrode 10 to the temperature-controlled member 14, process gas can be supplied into open spaces between opposed surfaces of the temperature-controlled member 14 and the support ring 12. In addition, a gas passage 27 is connected to a gas passage (not shown) in the annular ring 18 or confinement ring assembly 17 to allow pressure to be monitored in the plasma chamber 24. To maintain the process gas under pressure between the temperature-controlled member 14 and the support ring 12, an optional first O-ring seal 28 can be provided between an inner surface of the support ring 12 and an opposed surface of the temperature-controlled member 14, and an optional second O-ring seal 29 can be provided between an outer part of an upper surface of the support ring 12 and an opposed surface of the temperature-controlled member 14. In order to maintain a vacuum in the plasma chamber 24, additional optional O-rings 30, 32 can be provided between the temperature-controlled member 14 and a cylindrical member 18b, and between the cylindrical member 18b and a housing 18a.

In a preferred embodiment, at least lower baffle plate 22a is made of silicon carbide. Other baffle plates of the showerhead electrode assembly 10 are not directly exposed to plasma and, accordingly, plasma-induced erosion of these baffle plates is of less concern than for the lower baffle plate 22a. However, one or more of the other baffle plates may also be made of silicon carbide.

The silicon carbide baffle plate can be constructed to be a drop-in replacement part for existing baffle plates, or as a part of any gas distribution system wherein it is desired to reduce contamination attributable to that particular part. For example, the silicon carbide baffle plate can be used as a drop-in replacement for a baffle plate of an Exelan® or 4520XLE®, both of which are manufactured by the assignee of the present application, Lam Research Corporation.

Because the electrode assembly is a consumable part, it is desirable to use non-contaminating materials for the parts of the electrode assembly that are contacted by the plasma. Depending on the process gas chemistry, such materials are preferably aluminum-free conductive, semiconductive or insulating materials and can include, for example, glass, ceramic and/or polymer materials, such as single crystal or polycrystalline silicon, quartz; carbides, nitrides and/or oxides of silicon, boron, yttria, ceria, titanium, tantalum, niobium and/or zirconium; silicides of titanium, tungsten, tantalum and/or cobalt; diamond, and the like. Materials made of silicon, carbon, nitrogen and/or oxygen are most preferred for surfaces in a plasma reaction chamber.

The electrode can be an electrically conductive material, such as a planar silicon (e.g., single crystal silicon) or silicon carbide electrode disc having a uniform thickness from the center to the outer edge thereof. However, electrodes having nonuniform thickness (e.g., stepped electrodes described in U.S. Pat. No. 6,391,787) can also be used. Different materials and/or electrodes without process gas distribution holes could also be used with the electrode assembly. In a preferred embodiment, the electrode is a showerhead electrode provided with a plurality of spaced apart gas discharge passages having a size and distribution suitable for supplying a process gas, which is energized by the electrode and forms a plasma in the reaction chamber beneath the electrode.

Figure 3:
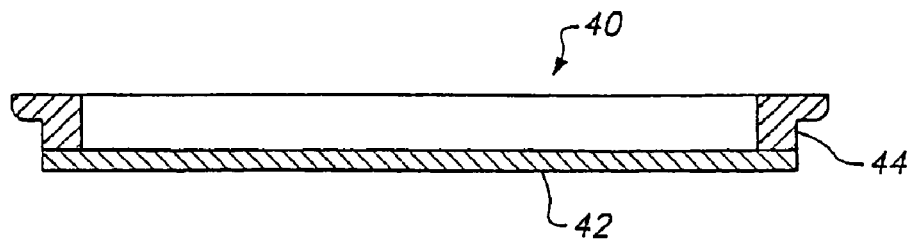
FIG. 3 is a side sectional view of an elastomer bonded showerhead electrode assembly according to a preferred embodiment.
Figure 4:
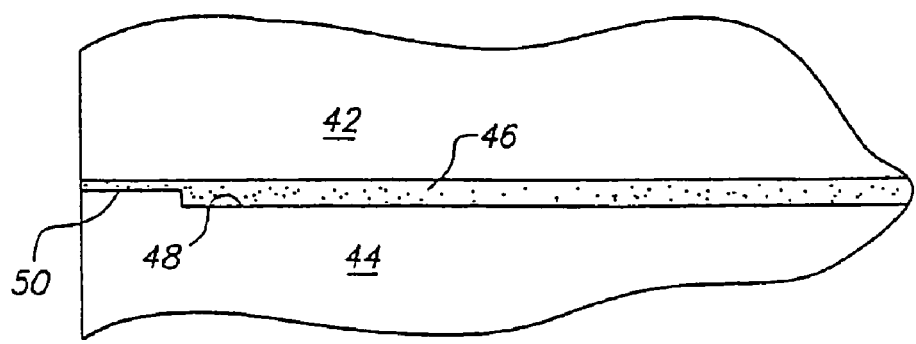
FIG. 4 is a partial side sectional view of the showerhead electrode assembly shown in FIG. 3.

FIG. 3 shows a showerhead electrode 40 that can be substituted for the showerhead electrode assembly including the showerhead electrode 10 and the support ring 12 shown in FIG. 2. In the showerhead electrode 40, the electrode 42 is bonded to the support ring 44 by an elastomeric joint 46, which can be located in a recess 48, as shown in FIG. 4. The recess 48 extends continuously around the support ring 44 between an inner wall (not shown) and an outer wall 50 of the support ring 44. Each wall 50 can be as thin as possible, e.g. about 30 mils wide, which allows the elastomer to form a thin layer (e.g. about 2 μm thick in the case where the elastomer includes 0.7 to 2 μm sized filler) in the area in contact with each wall 50 and a thicker layer (e.g. about 0.0025 inch) in the recess 48. The recess formed by the walls can be extremely shallow, e.g., about 2 mils deep, to provide a thin elastomeric joint having sufficient strength to adhesively bond the electrode to the support ring, but yet allow relative movement between the electrode 42 and the support ring 44 during temperature cycling of the showerhead electrode assembly 40.

The dimensions of the electrode assembly can be selected to meet the demands of the intended use of the electrode assembly. For example, if the electrode is used to process an 8 inch wafer, the electrode can have a diameter slightly less than about 9 inches, and the support ring can have a width at the interface between the electrode and the support ring of slightly less than about 0.5 inch.

The elastomeric joint can comprise any suitable elastomeric material, such as a polymer material, that is compatible with a vacuum environment and resistant to thermal degradation at high temperatures, e.g., above 200° C. The elastomer material can optionally include a filler of electrically and/or thermally conductive particles or other shaped filler, such as wire mesh, woven or non-woven conductive fabric, and the like. Further details of the elastomeric joint are described in commonly-owned U.S. Pat. No. 6,073,577, which is incorporated herein by reference in its entirety.

The silicon carbide components that have been treated to remove free-carbon can be provided in plasma processing chambers used for various plasma processes including plasma etching of various dielectric materials, such as doped silicon oxide, e.g., fluorinated silicon oxide (FSG); undoped silicon oxide, such as silicon dioxide; spin-on-glass (SOG); silicate glasses, such as boron phosphate silicate glass (BPSG) and phosphate silicate glass (PSG); doped or undoped thermally grown silicon oxide; doped or undoped TEOS deposited silicon oxide, and the like. The dielectric dopants include boron, phosphorus and/or arsenic. The dielectric material can overlie a conductive or semiconductive material layer, such as of polycrystalline silicon; metals, such as aluminum, copper, titanium, tungsten, molybdenum or alloys thereof; nitrides, such as titanium nitride; and metal silicides, such as titanium silicide, cobalt silicide, tungsten silicide, molybdenum silicide, and the like. For instance, the gas distribution system can be used for plasma etching a damascene structure.

The plasma can be a high-density plasma produced in various types of plasma processing apparatuses. Such plasma processing apparatuses typically have high-energy sources that use RF energy, microwave energy, magnetic fields, and the like to produce high-density plasma. For instance, high-density plasma can be produced in a transformer coupled plasma (TCP™), which is also called inductively-coupled plasma reactor, an electron-cyclotron resonance (ECR) plasma reactor, a helicon plasma reactor, or the like. An example of a high-flow plasma processing apparatus that can provide a high-density plasma is disclosed in commonly-owned U.S. Pat. No. 5,820,723, which is incorporated herein by reference in its entirety.

The present invention has been described with reference to preferred embodiments. However, it will be readily apparent to those skilled in the art that it is possible to embody the invention in specific forms other than as described above without departing from the spirit of the invention. The preferred embodiment is illustrative and should not be considered restrictive in any way. The scope of the invention is given by the appended claims, rather than the preceding description, and all variations and equivalents which fall within the range of the claims are intended to be embraced therein.

What is claimed is:

1. A silicon carbide component for a semiconductor substrate processing apparatus, the silicon carbide component being porous and comprising an interior and an exposed surface, the silicon carbide component having been (i) made by a graphite conversion process that results in the silicon carbide component including free-carbon in graphite form in the interior; (ii) treated to produce an exposed surface having the free-carbon in graphite form therein; and (iii) treated to remove the free-carbon such that at least the exposed surface is substantially free of the free-carbon, wherein the silicon carbide component is selected from the group consisting of a baffle plate, a plasma confinement ring and an edge ring.

2. The silicon carbide component of claim 1, wherein the silicon carbide component is a baffle plate.

3. A semiconductor substrate processing apparatus comprising a plasma processing chamber and at least one silicon carbide component according to claim 1 in the plasma processing chamber.

4. The semiconductor substrate processing apparatus of claim 3, wherein the plasma processing chamber is an etching chamber.

5. The silicon carbide component of claim 1, wherein the silicon carbide component has been treated and has not been installed in the semiconductor substrate processing apparatus.

6. The silicon carbide component of claim 1, wherein the silicon carbide component has been treated in an oxygen-containing atmosphere in a treatment vessel and has not been installed in the semiconductor substrate processing apparatus.

7. A semiconductor substrate processing apparatus comprising the silicon carbide component according to claim 1.

8. The silicon carbide component of claim 1, wherein the graphite comprises graphite clusters having a size of about 20 μm to about 200 μm.

9. The silicon carbide component of claim 1, wherein the exposed surface is a machined surface substantially free of the free-carbon and the interior of the silicon carbide component contains free-carbon in graphite form.

10. The silicon carbide component of claim 1, wherein the silicon carbide component has a thickness of up to about ¼ inch.

11. The silicon carbide component of claim 1, wherein (iii) comprises heating the silicon carbide component including free-carbon in an oxygen-containing atmosphere to remove all of the free-carbon at the exposed surface and at least about 80% of the number of particles and/or clusters of the graphite sized above about 50 μm in the interior.

12. A silicon carbide component for a semiconductor substrate processing apparatus, the silicon carbide component comprising an interior and an exposed surface, the interior containing free-carbon in graphite form and the exposed surface being substantially free of the free-carbon, wherein the silicon carbide component is selected from the group consisting of a baffle plate, a plasma confinement ring and an edge ring.

13. The silicon carbide component of claim 12, wherein the silicon carbide component is a baffle plate.

14. The silicon carbide component of claim 12, wherein the silicon carbide component has been treated and has not been installed in the semiconductor substrate processing apparatus.

15. The silicon carbide component of claim 12, wherein the silicon carbide component has been treated in an oxygen-containing atmosphere in a treatment vessel and has not been installed in the semiconductor substrate processing apparatus.

16. A semiconductor substrate processing apparatus comprising the silicon carbide component according to claim 12.

17. The silicon carbide component of claim 12, wherein the graphite comprises graphite clusters having a size of about 20 μm to about 200 μm.

18. The silicon carbide component of claim 12, wherein the exposed surface is a machined surface substantially free of the free-carbon and the interior of the silicon carbide component contains the free-carbon.

19. The silicon carbide component of claim 12, wherein the silicon carbide component has a thickness of up to about ¼ inch.

20. The silicon carbide component of claim 12, wherein the silicon carbide component including free-carbon has been treated in an oxygen-containing atmosphere to remove all of the free-carbon at the exposed surface and at least about 80% of the number of particles and/or clusters of the graphite sized above about 50 μm in the interior.

21. A silicon carbide baffle plate for a semiconductor substrate processing apparatus, the baffle plate comprising an interior and a machined exposed surface, the interior containing free-carbon particles or clusters in graphite form and the exposed surface being substantially free of the free-carbon.

22. The silicon carbide baffle plate of claim 21, wherein the silicon carbide component has been treated and has not been installed in the semiconductor substrate processing apparatus.

23. The silicon carbide component of claim 21, wherein the silicon carbide baffle plate including free-carbon has been treated in an oxygen-containing atmosphere to remove all of the free-carbon at the exposed surface and at least about 80% of the number of the particles and/or clusters above about 50 μm in the interior.

* * * * *